(12) United States Patent
Wang et al.

(10) Patent No.: US 10,571,362 B2
(45) Date of Patent: Feb. 25, 2020

(54) GENTLE START-UP DEVICE, HYDRAULIC GENERATOR TEST PLATFORM AND HYDRAULIC GENERATOR SET

(71) Applicant: METAL INDUSTRIES RESEARCH & DEVELOPMENT CENTRE, Kaohsiung (TW)

(72) Inventors: Bo-Han Wang, Kaohsiung (TW); Cheng-En Wu, Kaohsiung (TW); Ren-Yo Huang, Kaohsiung (TW)

(73) Assignee: METAL INDUSTRIES RESEARCH & DEVELOPMENT CENTRE, Kaohsiung (TW)

( * ) Notice: Subject to any disclaimer, the term of this patent is extended or adjusted under 35 U.S.C. 154(b) by 7 days.

(21) Appl. No.: 15/841,809

(22) Filed: Dec. 14, 2017

(65) Prior Publication Data

US 2019/0187023 A1    Jun. 20, 2019

(51) Int. Cl.

| | |
|---|---|
| *G01M 10/00* | (2006.01) |
| *F03B 17/06* | (2006.01) |
| *G01M 13/00* | (2019.01) |
| *G01R 31/34* | (2006.01) |
| *F03B 11/00* | (2006.01) |
| *F03B 15/00* | (2006.01) |

(52) U.S. Cl.
CPC ........... *G01M 10/00* (2013.01); *F03B 11/008* (2013.01); *F03B 15/005* (2013.01); *F03B 17/061* (2013.01); *G01M 13/00* (2013.01); *G01R 31/34* (2013.01); *F05B 2250/80* (2013.01); *F05B 2260/83* (2013.01); *F05B 2260/85* (2013.01)

(58) Field of Classification Search
CPC .......................... F03B 11/008; F05B 2260/83
See application file for complete search history.

(56) References Cited

U.S. PATENT DOCUMENTS

| | | | | |
|---|---|---|---|---|
| 2010/0213138 A1* | 8/2010 | Cho | ......................... | C02F 1/005 210/758 |
| 2011/0259039 A1* | 10/2011 | Ma | ........................... | F25B 15/02 62/495 |
| 2017/0067963 A1* | 3/2017 | Sydnor | .................. | F03B 11/008 |

* cited by examiner

*Primary Examiner* — Daniel S Larkin
(74) *Attorney, Agent, or Firm* — WPAT, PC

(57) ABSTRACT

A gentle start-up device includes: a rotational type hollow pipe body, including an inlet and an outlet, and having an inner wall provided with a plurality of bar-shaped fins; a transmission unit, physically connected to the rotational type hollow pipe body; and a driving unit, physically connected to the transmission unit for driving the transmission unit to rotate the rotational type hollow pipe body in a rotational direction and to achieve a predetermined rotational speed according to a water supply flow value of a water turbine of a hydraulic generator set, whereby water flow which passes through the rotational type hollow pipe body generates rotational flow.

10 Claims, 8 Drawing Sheets

GENTLE START-UP DEVICE, HYDRAULIC GENERATOR TEST PLATFORM AND HYDRAULIC GENERATOR SET

BACKGROUND

Technical Field

The present disclosure relates to a gentle start-up device, a hydraulic generator test platform and a hydraulic generator set, and particularly to a gentle start-up device which overcomes the static frictional torque of the hydraulic generator set during small water flow, and substantially prevents fans of a water turbine from damage during large water flow.

Related Art

Referring to FIG. 1, it shows a conventional small-type hydraulic generator set 9. The small-type hydraulic generator set 9 is a typical generator set having output electrical power which is less than 100 Kw. The small-type hydraulic generator set 9 uses a water turbine 91 to rotate a rotor of a generator 92 so as to generate the electrical power. The power generation principle of the small-type hydraulic generator set 9 is that fans of a water turbine 91 are connected to the rotor of a generator 92 through bearings, the fans of the water turbine 91 and the rotor of a generator 92 are driven by kinetic energy transformed from potential energy resulted from moving water having a perpendicular drop H from a high position to a low position, the magnetic field is changed between a coil of the rotor and a magnet of the stator, and thus an induced current is generated, whereby the small-type hydraulic generator set 9 is an electric power generation device.

When the small-type hydraulic generator set is tested, a flow signal and a pressure signal of a water supply end, and voltage signals, current signals, temperature signals and rotational speed signals of the small-type hydraulic generator set are measured to be data of a performance test of the small-type hydraulic generator set during power generation at different rotational speed. However, when the water flow is small, the small-type hydraulic generator set cannot be started up, because the static frictional torque cannot be overcome; when the water flow is large, the fans of the water turbine may be damaged, because the large water flow often attacks and damages the fans of the water turbine. In the prior art, generally the generator and the water turbine are tested separately in order to solve the above-mentioned problem, but the test data of the generator and the water turbine which are tested separately are different from the test data of the hydraulic generator set which is tested integrally.

In view of this, it is necessary to provide a gentle start-up device, to solve the foregoing problems.

SUMMARY

A main objective of the present disclosure is to provide a gentle start-up device which overcomes the static frictional torque of the hydraulic generator set during small water flow, and substantially prevents fans of a water turbine from damage of large water flow during large water flow.

In order to achieve the foregoing objective, the present disclosure provides a gentle start-up device including: a rotational type hollow pipe body, including an inlet and an outlet, and having an inner wall provided with a plurality of bar-shaped fins; a transmission unit, physically connected to the rotational type hollow pipe body; and a driving unit, physically connected to the transmission unit for driving the transmission unit to rotate the rotational type hollow pipe body in a rotational direction and to achieve a predetermined rotational speed according to a water supply flow value of a water turbine of a hydraulic generator set, whereby water flow which passes through the rotational type hollow pipe body generates rotational flow.

The gentle start-up device further includes: a first bearing, disposed at the inlet of the rotational type hollow pipe body, and comprising a mounting portion and a rotating portion, wherein the rotating portion is relative to the mounting portion to be rotated, and the mounting portions of the first bearing are adapted to support the rotational type hollow pipe body; a second bearing, disposed at the outlet of the rotational type hollow pipe body, and comprising a mounting portion and a rotating portion, wherein the rotating portion is relative to the mounting portion to be rotated, and the mounting portions of the second bearing are adapted to support the rotational type hollow pipe body; a first bearing flange, having one side mounted on the mounting portion of the first bearing, and comprising a hollow interior which is communicated with the inlet of the rotational type hollow pipe body; and a second bearing flange, having one side mounted on the mounting portion of the second bearing, and comprising a hollow interior which is communicated with the outlet of the rotational type hollow pipe body.

The present disclosure further provides a hydraulic generator test platform, including: a water pump system, adapted to provide water supply flow value and water supply pressure value so as to simulate water supply flow value and water supply pressure value at an actual site, wherein the water pump system comprises a pipe flange of a water supply end; a gentle start-up device, being the above-mentioned gentle start-up device, wherein the other side of the first bearing flange is screwed to the pipe flange of the water supply end; a hydraulic generator set, comprising a water turbine having an inlet pipe flange which is screwed to the other side of the second bearing flange; and a computer control system, electrically connected to the water pump system, the gentle start-up device and the hydraulic generator set, and comprising: a controller unit, adapted to control a water supply flow value and a water supply pressure value of the water pump system; a sensor unit, adapted for measuring flow signals and pressure signals of the water supply end; and a processor unit, electrically connected to the controller unit and the sensor unit for providing a control command to the controller unit so as to control the water pump system, to control the switching on or off of the gentle start-up device, and to execute a performance test of the hydraulic generator set.

When the water flow is small, the gentle start-up device of the present disclosure can overcome the static frictional torque of the hydraulic generator set. Furthermore, when the water flow is large, the gentle start-up device of the present disclosure can substantially prevent the fans of the water turbine from damage of the large water flow. A small-type hydraulic generator set (having output electrical power is less than 100 Kw) can be tested integrally at the hydraulic generator test platform of the present disclosure, and thus the generator and the water turbine of the small-type hydraulic generator set doesn't be tested separately.

To make the foregoing and other objectives, features, and advantages of the present disclosure more evident, detailed description is made hereinafter as follows with reference to the accompanying drawings.

DETAILED DESCRIPTION

Figure 1:
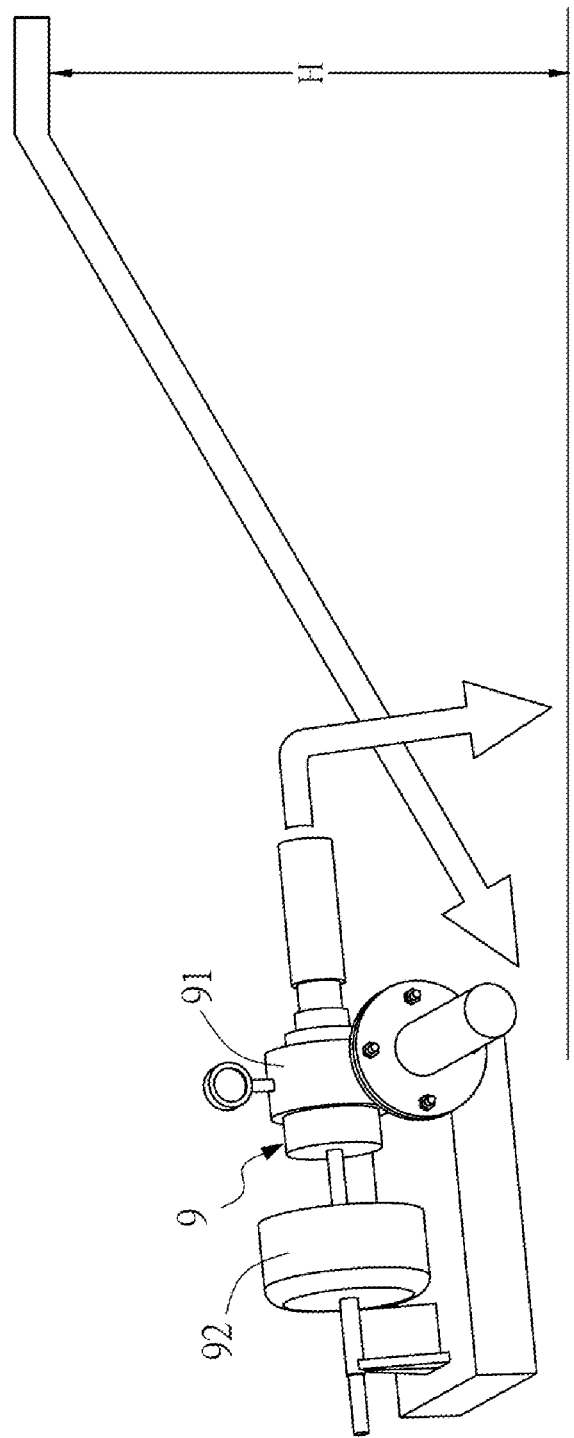
FIG. 1 is a perspective schematic view of a conventional small-type hydraulic generator set.
Figure 2:
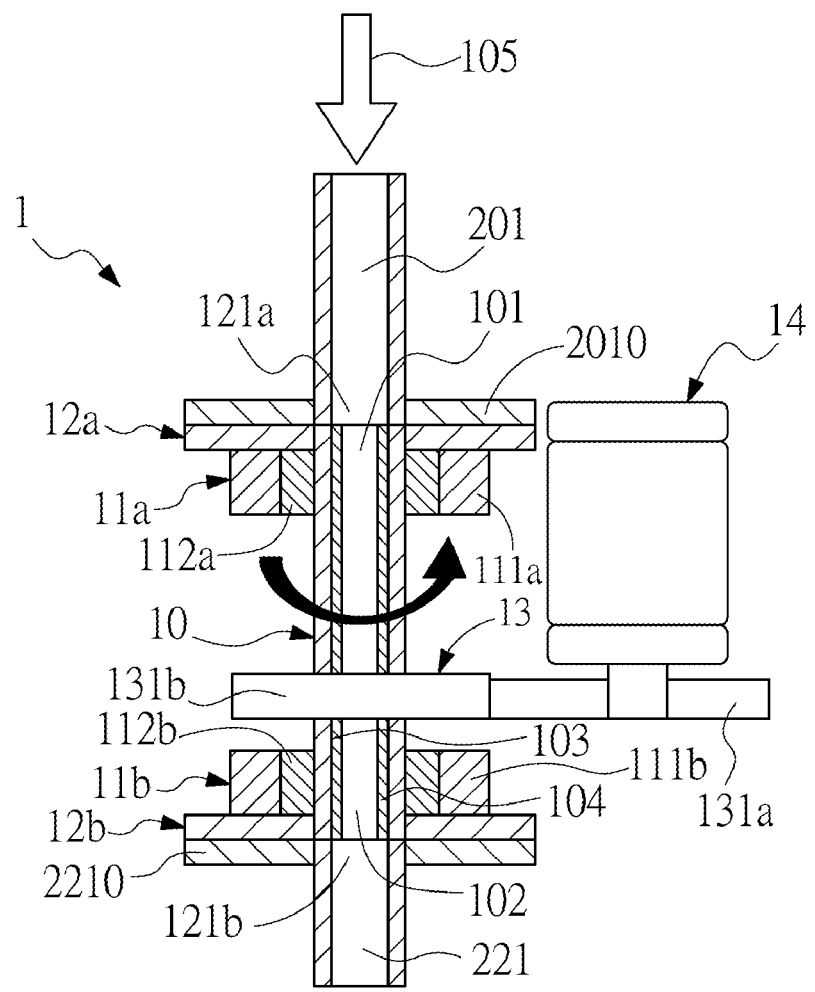
FIG. 2 is a sectional schematic view of a start-up device according to an embodiment of the present disclosure.
Figure 3:
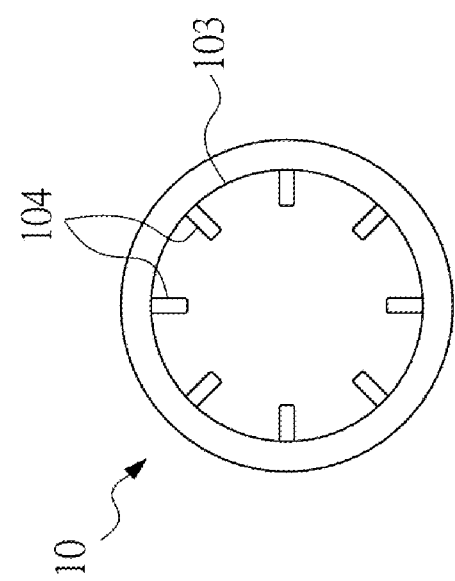
FIG. 3 is a plane schematic view of a rotational type hollow pipe body of a gentle start-up device according to the present disclosure.

Referring to FIG. 2, it shows a start-up device according to an embodiment of the present disclosure. The start-up device is a kind of gentle start-up device 1. The gentle start-up device 1 includes: a rotational type hollow pipe body 10, first and second bearings 11a, 11b, first and second bearing flanges 12a, 12b, a transmission unit 13 and a driving unit 14. The rotational type (i.e., rotatable) hollow pipe body 10 includes an inlet 101 and an outlet 102, and has an inner wall 103, which is provided with a plurality of bar-shaped fins. In this embodiment, the bar-shaped fins 104 can be extended in the axial direction 105 of the rotational type hollow pipe body 10, and the bar-shaped fins 104 can be arranged in a ring-shaped mode, shown in FIG. 3.

Referring to FIG. 2 again, the first bearing 11a is disposed at the inlet 101 of the rotational type hollow pipe body 10, and includes a mounting portion 111a and a rotating portion 112a; and the second bearing 11b is disposed at the outlet 102 of the rotational type hollow pipe body 10, and include a mounting portion 111b and a rotating portion 112b. Relative to the mounting portions 111a, 111b, the rotating portions 112a, 112b can be rotated, wherein the rotating portions 112a, 112b of the first and second bearings 11a, 11b are adapted to support the rotational type hollow pipe body 10.

One side of first bearing flange 12a is mounted on the mounting portion 111a of the first bearing 11a, and the first bearing flange 12a includes a hollow interior 121a which is communicated with the inlet 101 of the rotational type hollow pipe body 10; and, one side of second bearing flange 12b is mounted on the mounting portion 111b of the second bearing 11b, and the second bearing flange 12b includes a hollow interior 121b which is communicated with the outlet 102 of the rotational type hollow pipe body 10. The other side of the first bearing flange 12a is screwed to a pipe flange 2010 of a water supply end 201, and the other side of the second bearing flange 12b is screwed to an inlet pipe flange 2210 of a water turbine 221 of a hydraulic generator set, whereby the water supply end 201, the gentle start-up device 1 and the water turbine 221 are communicated in order. The above-mentioned screw mode is that two elements are connected to each other by using screws. The above-mentioned hydraulic generator set can be a small-type hydraulic generator set having output electrical power which is less than 100 Kw.

Figure 4:
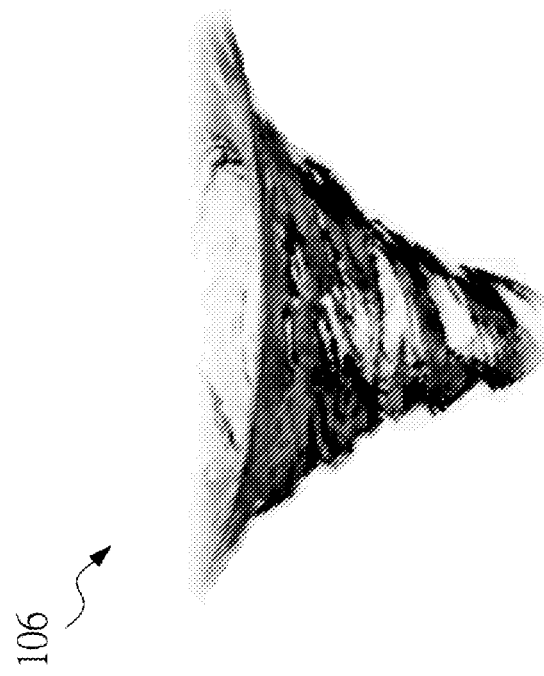
FIG. 4 is a perspective schematic view showing that water flow which passes through the rotational type hollow pipe body generates rotational flow.

The transmission unit 13 is physically connected to the rotational type hollow pipe body 10. The transmission unit 13 includes a plurality of gears 131a, 131b which are engaged to each other or includes a transmission belt (not shown). The driving unit 14 is physically connected to the transmission unit 13 for driving the transmission unit 13 to rotate the rotational type hollow pipe body 10 in the rotational direction and to achieve a predetermined rotational speed according to a water supply flow value of the water turbine 221 of the hydraulic generator set, whereby water flow which passes through the rotational type hollow pipe body 10 generates rotational flow 106, shown in FIG. 4. The driving unit 14 can be a servomotor.

Figure 5:
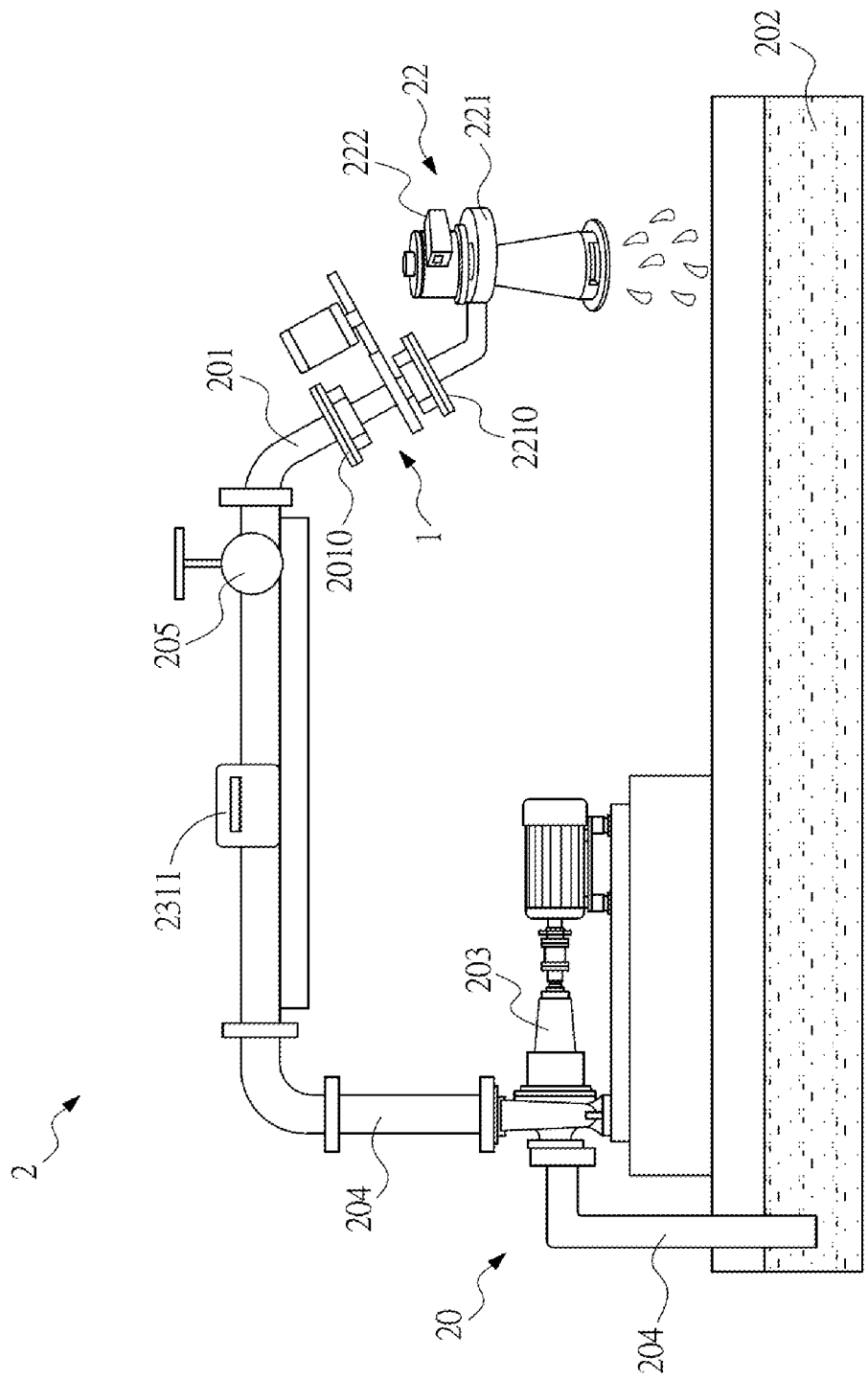
FIG. 5 is a sectional schematic view of a hydraulic generator test platform according to an embodiment of the present disclosure.
Figure 6:
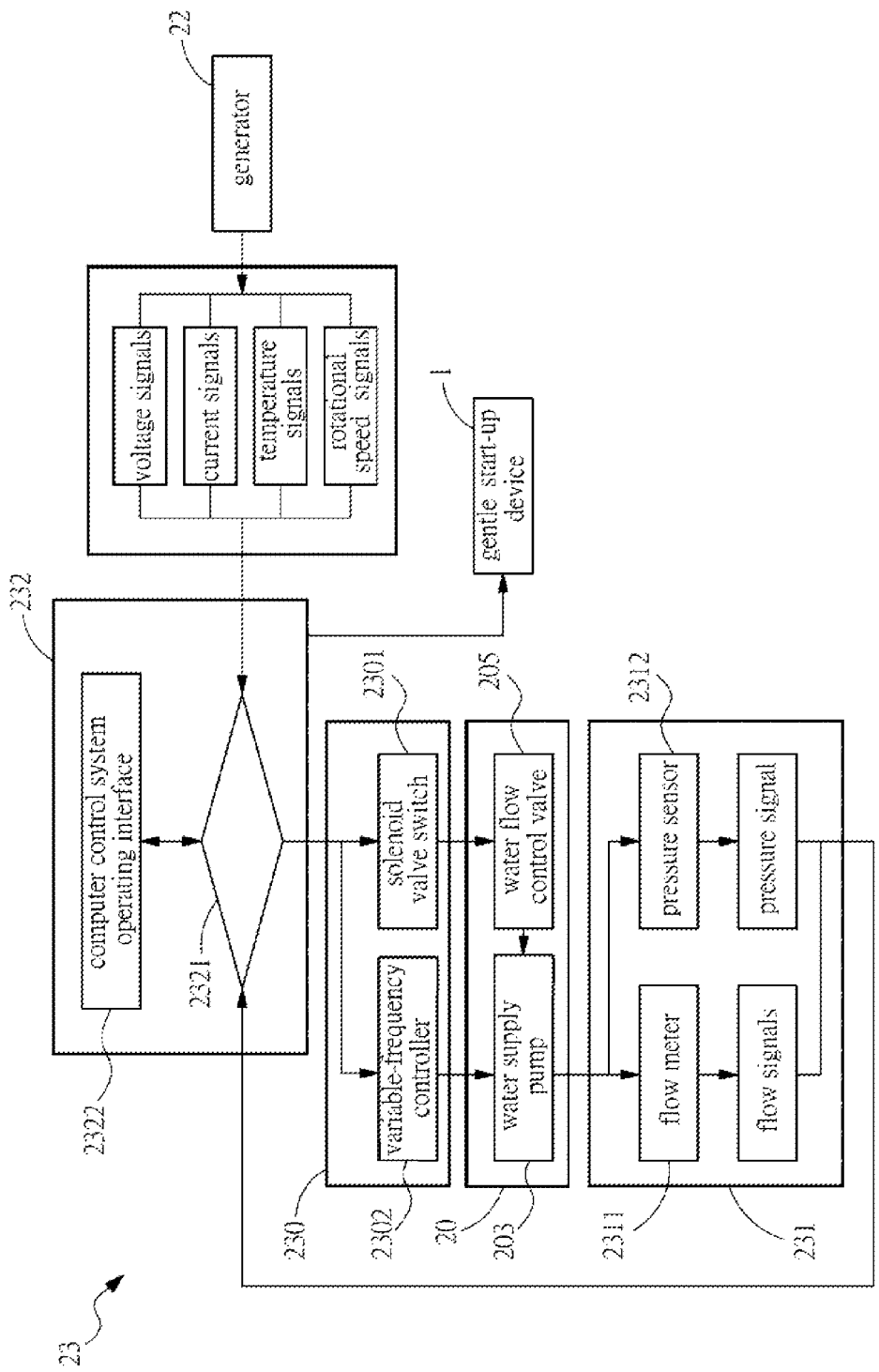
FIG. 6 is a schematic view of a control structure of a computer control system of a hydraulic generator test platform according to an embodiment of the present disclosure.

Referring to FIGS. 5 and 6, they show a hydraulic generator test platform 2 according to an embodiment of the present disclosure. The hydraulic generator test platform 2 includes: a water pump system 20, a gentle start-up device 1, a hydraulic generator set 22 and a computer control system 23. The water pump system 20 is adapted to provide a water supply flow value and water supply pressure value so as to simulate a water supply flow value and a water supply pressure value at an actual site, wherein the water pump system 20 includes a pipe flange 2010 of a water supply end 201. As requested, the pipe size of the water supply end 201 can be changed to different sizes, for example, 1.5"/2"/2.5"/3"/4"/5"/6"/8"/10"/12"(inch) for testing the hydraulic generator set 22 having a different power output. The water pump system 20 further includes a water supply tank 202, a water support pump 203, a water flow control valve 205 and a pipe unit 204. The pipe unit 204 is adapted to communicate with the water supply tank 202, the water support pump 203, the water flow control valve 205 and the water supply end 201 in order. The water support pump 203 is adapted to compress and deliver water from the water supply tank 202 to the water supply end 201.

The gentle start-up device 1 is the above-mentioned gentle start-up device. Referring to FIGS. 2 and 5 again, likewise, one side of first bearing flange 12a is mounted on the mounting portion 111a of the first bearing 11a; and, one side of second bearing flange 12b is mounted on the mounting portion 111b of the second bearing 11b. The first bearing flange 12a includes a hollow interior 121a which communicates with the inlet 101 of the rotational type hollow pipe body 10; and, the second bearing flange 12b includes a hollow interior 121b which communicates with the outlet 102 of the rotational type hollow pipe body 10. The other side of the first bearing flange 12a is screwed to the pipe flange 2010 of the water supply end 201, and the inlet pipe flange 2210 of the water turbine 221 of the hydraulic generator set 22 is screwed to the other side of the second bearing flange 12b, whereby the water supply end 201, the gentle start-up device 1 and the water turbine 221 are communicated in order.

Referring to FIGS. 5 and 6 again, the computer control system 23 is electrically connected to the water pump system 20, the gentle start-up device 1 and the hydraulic generator set 22, and includes: a controller unit 230, a sensor unit 231 and a processor unit 232. The controller unit 230 includes a solenoid valve switch 2301 and a variable-frequency controller 2302 for controlling the water flow control valve 205 and the water supply pump 203 of the water pump system 20 respectively, so as to control a water supply flow value and a water supply pressure value of the water pump system 20. The solenoid valve switch 2301 controls a valve opening of the water flow control valve 205 from zero degrees to ninety degrees.

The sensor unit 231 includes a flow meter 2311 (e.g., electromagnetic flow meter) and a pressure sensor 2312 for measuring flow signals and pressure signals of the water supply end 201. The processor unit 232 is electrically connected to the controller unit 230 and the sensor unit 231, and includes a signal transforming interface 2321 and a computer control system operating interface 2322 for providing a control command to the controller unit 230 so as to control the water pump system 20, to control the switching on or off of the gentle start-up device 1, and to execute a performance test of the hydraulic generator set 22. The performance test of the hydraulic generator set 22 includes flow signals and pressure signals of the water supply end 201, and voltage signals, current signals, temperature signals and rotational speed signals of the hydraulic generator set 22.

Figure 7:
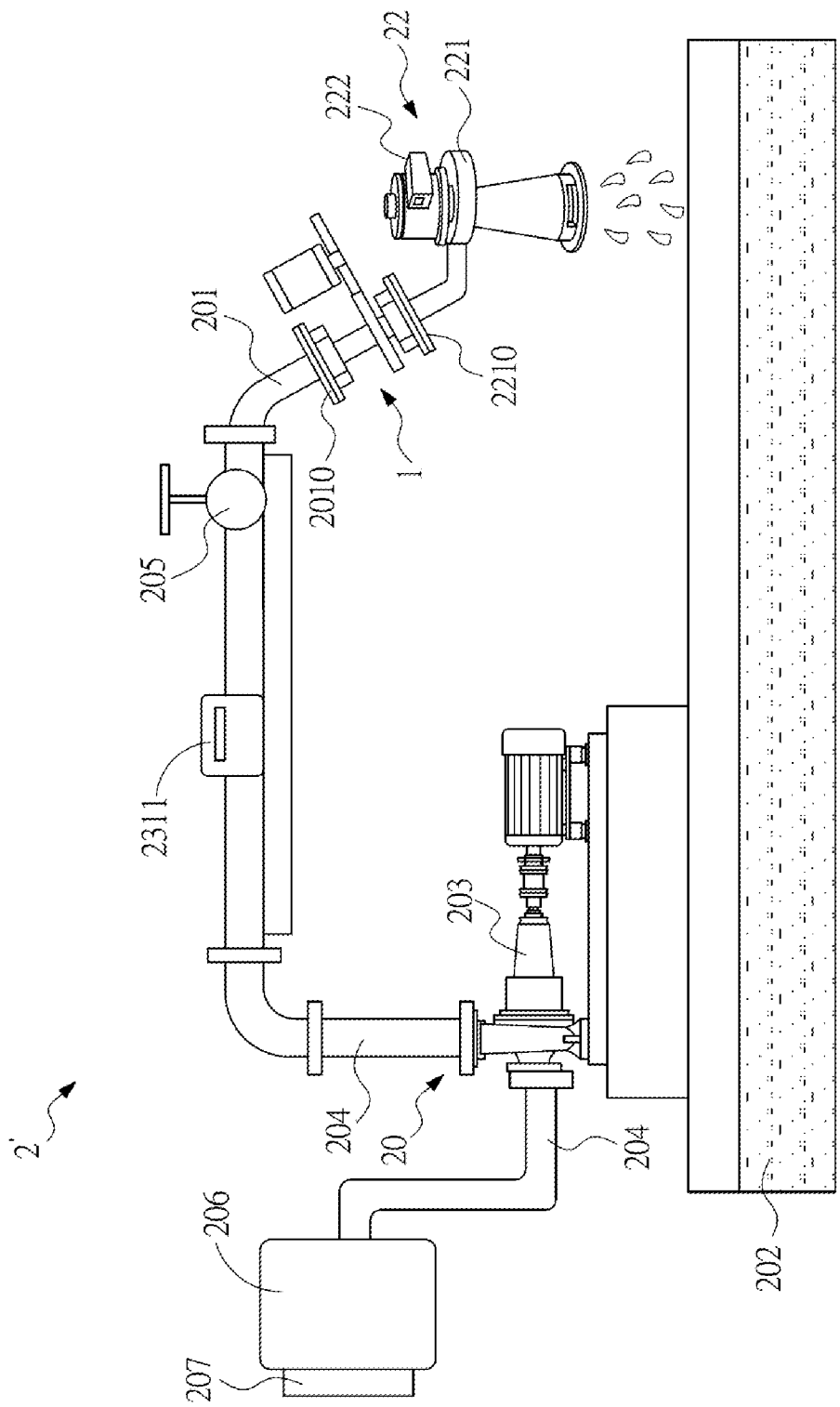
FIG. 7 is a sectional schematic view of a hydraulic generator test platform according to another embodiment of the present disclosure.
Figure 8:
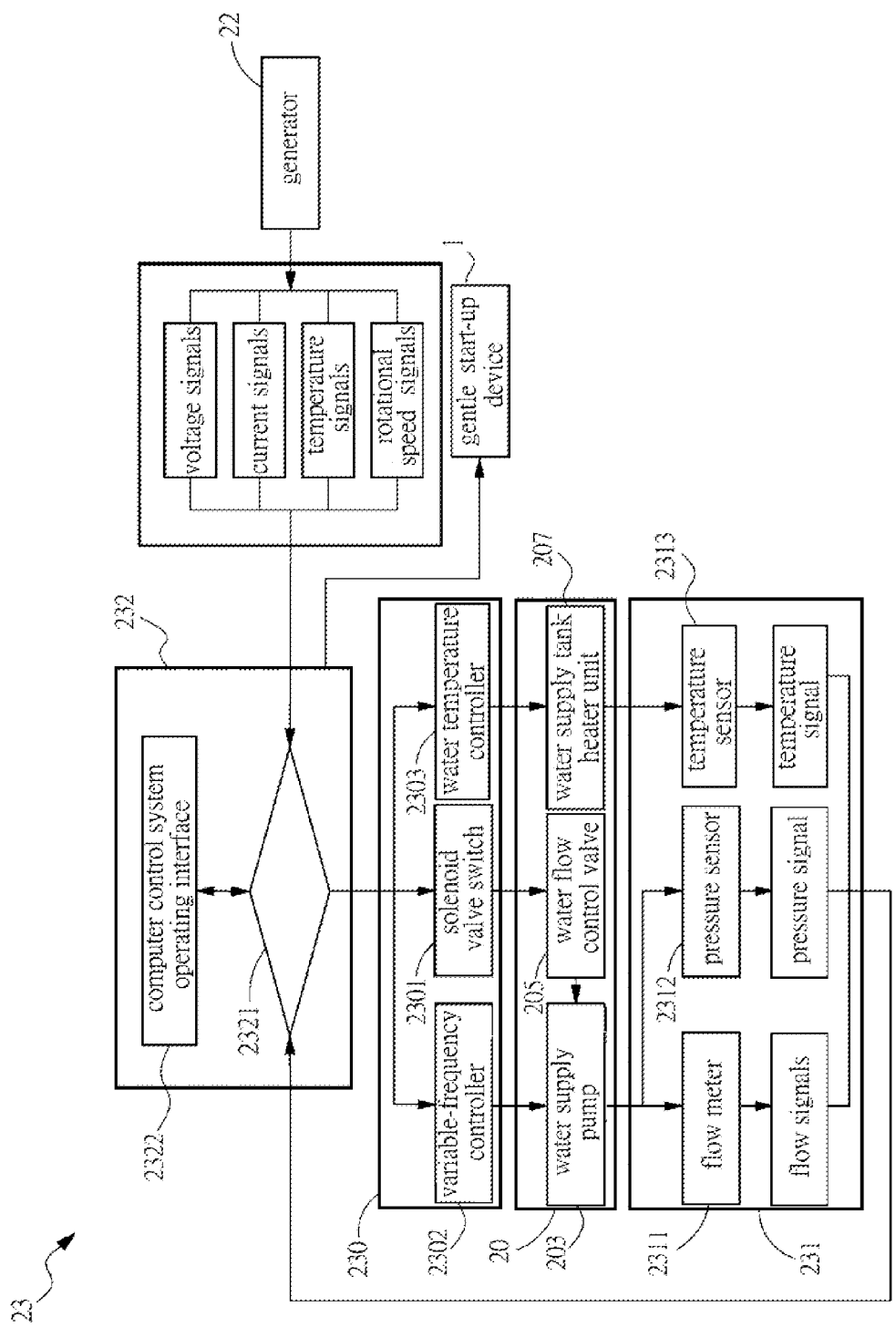
FIG. 8 is a schematic view of a control structure of a computer control system of a hydraulic generator test platform according to another embodiment of the present disclosure.

Referring to FIGS. 7 and 8, it shows a hydraulic generator test platform 2' according to another embodiment of the present disclosure. The hydraulic generator test platform 2' is similar to the hydraulic generator test platform 2, and the similar elements have been designated by similar reference numbers. The differences between the two embodiments are that: the performance test of the hydraulic generator set 22 of the hydraulic generator test platform 2' further includes temperature signals of the water supply end 201; the water pump system 20 further includes a water supply tank heater unit 207 (e.g., resistance type heater) for heating a water supply tank 206; the controller unit 230 further includes a water temperature controller 2303 for controlling the water supply tank heater unit 207 to heat the water supply tank 206; and, the sensor unit 231 further includes a temperature sensor 2313 for measuring temperature signals of the water supply end 201.

For example, a performance test method of the hydraulic generator set 22 includes the following steps. First step: the water support pump 203 is switched on, the water is compressed and delivered from the water supply tank 202 to the water supply end 201. At this time, the valve opening of the water flow control valve 205 is zero degrees. Second step: the gentle start-up device 1 is switched on, the rotational speed of the rotational type hollow pipe body 10 of the gentle start-up device 1 complies with the water supply flow value of the water turbine 221 (e.g., one third of rated flow value of the water turbine 221 can be a setting value of the water flow). Third step: the solenoid valve switch 2301 controls the valve opening of the water flow control valve 205 from zero degrees to a specific degree. At this time, the water from the water supply end 201 enters the rotational type hollow pipe body 10 of the gentle start-up device 1, water flow which passes through the rotational type hollow pipe body 10 generates a rotational flow, and then the rotational flow enters the water turbine 221 of the hydraulic generator set 22. Fourth step: when a numerical value of the voltage signal of the hydraulic generator set 22 appeared, the gentle start-up device 1 is switched off to stop rotating the rotational type hollow pipe body 10. Fifth step: a performance test of the hydraulic generator set 22 is executed. At this time, the water from the water supply end 201 still passes through the rotational type hollow pipe body 10 which is fixed, and then the water enters the water turbine 221 of the hydraulic generator set 22.

The hydraulic generator test platform of the present disclosure is specially applied to a small type hydraulic field, e.g., small water flow value (0.05 m$^3$/s) and low head (5 m). Furthermore, the hydraulic generator test platform of the present disclosure can be corresponding to different small type hydraulic field to adjust water supply temperature, water supply flow value and water supply pressure value, to have pipe matching design, to test the operating performance and capacity of the hydraulic generator set, and to supervise real-time water flow value.

When the water flow is small, the gentle start-up device of the present disclosure can overcome the static frictional torque of the hydraulic generator set. Furthermore, when the water flow is large, the gentle start-up device of the present disclosure can substantially prevent the fans of the water turbine from damage of the large water flow. The generator and the water turbine of a small-type hydraulic generator set (having output electrical power is less than 100 Kw) can be tested integrally at the hydraulic generator test platform of the present disclosure, and thus the generator and the water turbine of the small-type hydraulic generator set doesn't need to be tested separately.

Figure 9:
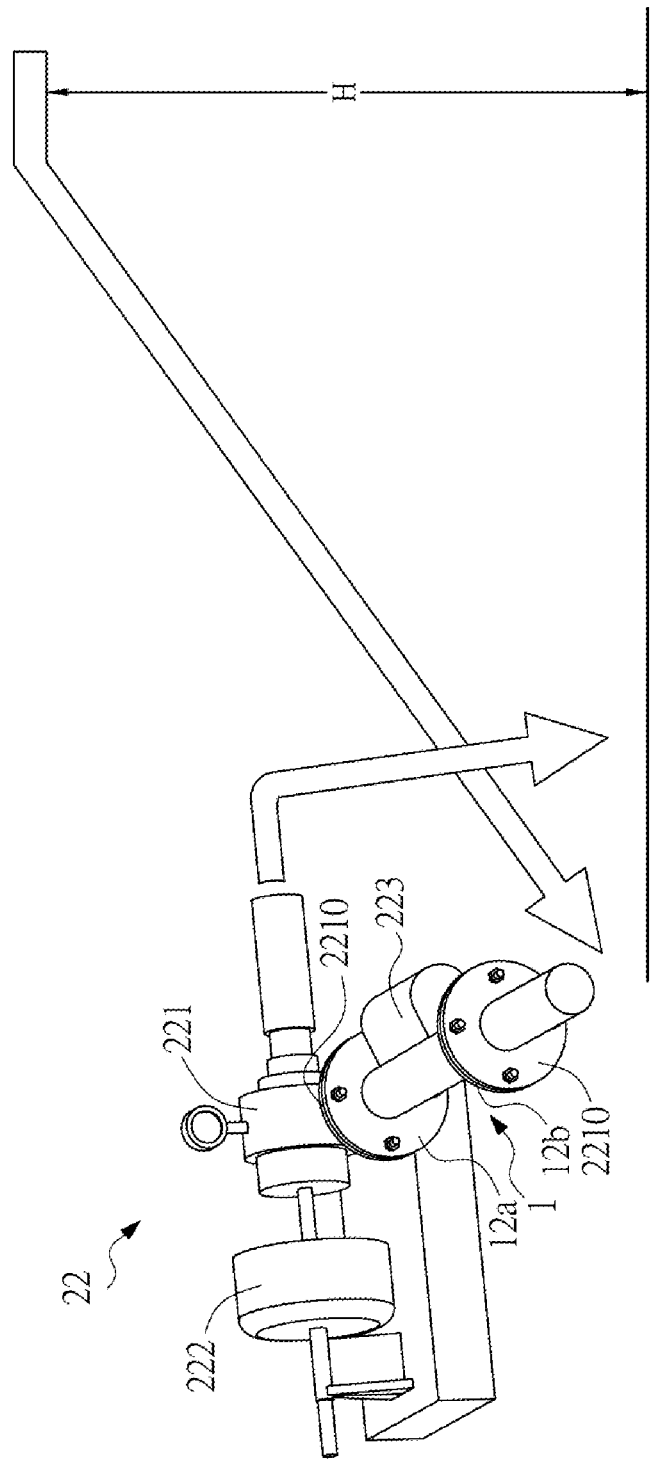
FIG. 9 is a perspective schematic view of a hydraulic generator set according to an embodiment of the present disclosure.

Referring to FIG. 9, it shows a hydraulic generator set 22 according to an embodiment of the present disclosure. The hydraulic generator set 22 includes: a generator 222, a water turbine 221 and a gentle start-up device 1. The water turbine 221 is mechanically connected to the generator 222, and has an inlet pipe flange 2210. The potential energy resulted from moving water having a perpendicular drop H from a high position to a low position can be transformed to kinetic energy by using the water turbine 221, so as to drive the generator 222 and then to generate electric power. The hydraulic generator set 22 further includes: a protective cover 223 for covering the gentle start-up device 1.

The gentle start-up device 1 is the above-mentioned gentle start-up device. Referring to FIGS. 2 and 9 again, likewise, one side of first bearing flange 12a of the gentle start-up device 1 is mounted on the mounting portion 111a of the first bearing 11a; and, one side of second bearing flange 12b is mounted on the mounting portion 111b of the second bearing 11b. The first bearing flange 12a includes a hollow interior 121a which communicates with the inlet 101 of the rotational type hollow pipe body 10; and, the second bearing flange 12b includes a hollow interior 121b which communicates with the outlet 102 of the rotational type hollow pipe body 10. The other side of the first bearing flange 12a is screwed to a pipe flange 2010 of a water supply end 201 of an external water source (e.g., river, farmland waterways or hot spring source), and the other side of second bearing flange 12b is screwed to the inlet pipe flange 2210 of the water turbine 221 of the hydraulic generator set 22, whereby the water supply end 201, the gentle start-up device 1 and the water turbine 221 are communicated in order.

For example, an operation method of the hydraulic generator set 22 includes the following steps. First step: water is sensed whether the water is delivered to the water supply end 201 for the first time. Second step: if first step is "Yes," then the gentle start-up device 1 is switched on, the rotational speed of the rotational type hollow pipe body 10 of the gentle start-up device 1 complies with the water supply flow value of the water turbine 221 (e.g., one third of rated flow value of the water turbine 221 can be a setting value of the water flow). Third step: the water from the water supply end 201 enters the rotational type hollow pipe body 10 of the gentle start-up device 1, water flow which passes through the rotational type hollow pipe body 10 generates a rotational flow, and then the rotational flow enters the water turbine 221 of the hydraulic generator set 22. Fourth step: when a numerical value of the voltage signal of the hydraulic generator set 22 appears, the gentle start-up device 1 is switched off to stop rotating the rotational type hollow pipe body 10. Fifth step: the water from the water supply end 201 still passes through the rotational type hollow pipe body 10 which is fixed, and then the water enters the water turbine 221 of the hydraulic generator set 22.

When the water flow is small, the gentle start-up device of the present disclosure can overcome the static frictional torque of the hydraulic generator set. Furthermore, when the water flow is large, the gentle start-up device of the present disclosure can substantially prevent the fans of the water turbine from damage from the large water flow.

The above merely describes implementations or embodiments of technical means employed by the present disclosure to solve the technical problems, which are not intended to limit the patent implementation scope of the present disclosure. Equivalent changes and modifications in line with the meaning of the patent scope of the present disclosure or made according to the scope of the invention patent are all encompassed in the patent scope of the present disclosure.

What is claimed is:

1. A start-up device, comprising:
    a rotatable hollow pipe body, comprising an inlet and an outlet, and having an inner wall provided with a plurality of fins;
    a transmission unit, physically connected to the rotatable hollow pipe body; and
    a driving unit, physically connected to the transmission unit for driving the transmission unit to rotate the rotatable hollow pipe body in a rotational direction and to achieve a predetermined rotational speed according to a water supply flow value of a water turbine of a hydraulic generator set, whereby water flow which passes through the rotatable hollow pipe body generates rotational flow.

2. The start-up device according to claim 1, further comprising:
    a first bearing, disposed at the inlet of the rotatable hollow pipe body, and comprising a mounting portion land a rotating portion, wherein the rotating portion is relative to the mounting portion to be rotated, and the mounting portions of the first bearing are adapted to support the rotatable hollow pipe body;
    a second bearing, disposed at the outlet of the rotatable hollow pipe body, and comprising a mounting portion and a rotating portion, wherein the rotating portion is relative to the mounting portion to be rotated, and the mounting portions of the second bearing are adapted to support the rotatable hollow pipe body;
    a first bearing flange, having one side mounted on the mounting portion of the first bearing, and comprising a hollow interior which is communicated with the inlet of the rotatable hollow pipe body; and
    a second bearing flange, having one side mounted on the mounting portion of the second bearing, and comprising a hollow interior which is communicated with the outlet of the rotatable hollow pipe body.

3. The start-up device according to claim 2, wherein the other side of the first bearing flange is screwed to a pipe flange of a water supply end, and the other side of the second bearing flange is screwed to an inlet pipe flange of a water turbine of a hydraulic generator set, whereby the water supply end, the start-up device and the water turbine are communicated in order.

4. A hydraulic generator test platform, comprising:
    a water pump system, adapted to provide a water supply flow value and a water supply pressure value so as to simulate a water supply flow value and a water supply pressure value at an actual site, wherein the water pump system comprises a pipe flange of a water supply end;
    a start-up device, being the start-up device according to claim 2, wherein the other side of the first bearing flange is screwed to the pipe flange of the water supply end;
    a hydraulic generator set, comprising a water turbine having an inlet pipe flange which is screwed to the other side of the second bearing flange; and
    a computer control system, electrically connected to the water pump system, the start-up device and the hydraulic generator set, and comprising:
        a controller unit, adapted to control the water supply flow value and the water supply pressure value of the water pump system;
        a sensor unit, adapted for measuring flow signals and pressure signals of the water supply end; and
        a processor unit, electrically connected to the controller unit and the sensor unit for providing a control command to the controller unit so as to control the water pump system, to control the switching on or off of the start-up device, and to execute a performance test of the hydraulic generator set.

5. The hydraulic generator test platform according to claim 4, wherein a performance test of the hydraulic generator set comprises flow signals and pressure signals of the water supply end, and voltage signals, current signals, temperature signals and rotational speed signals of the hydraulic generator set.

6. The hydraulic generator test platform according to claim 5, wherein:
    the water pump system further comprises a water support pump and a water flow control valve;
    the controller unit comprises a solenoid valve switch and a variable-frequency controller for controlling the water flow control valve and the water supply pump of the water pump system; and
    the sensor unit comprises a flow meter and a pressure sensor for measuring the flow signals and the pressure signals.

7. The hydraulic generator test platform according to claim 6, wherein:
    the performance test of the hydraulic generator set further comprises temperature signals of the water supply end;
    the water pump system further comprises a water supply tank heater unit;
    the controller unit further comprises a water temperature controller for controlling the water supply tank heater unit to heat a water supply tank; and
    the sensor unit further comprises a temperature sensor for measuring temperature signals of the water supply end.

8. A hydraulic generator test platform, comprising:
    a generator;
    a water turbine, mechanically connected to the generator, and having an inlet pipe flange; and
    a start-up device, being the start-up device according to claim 2, wherein the other side of the first bearing flange is screwed to the pipe flange of the water supply end, and the other side of the second bearing flange is screwed to the inlet pipe flange of the water turbine.

9. The start-up device according to claim 1, wherein the fins are extended in an axial direction of the rotatable hollow pipe body, and the fins are arranged in a ring-shaped mode.

10. The start-up device according to claim 1, wherein the transmission unit comprises a plurality of gears which are engaged to each other or a transmission belt, and the driving unit is a servomotor.

\* \* \* \* \*